United States Patent [19]

Conner

[11] 4,213,061
[45] Jul. 15, 1980

[54] ELECTRONICALLY ACTUATED ELECTRIC SWITCH

[76] Inventor: Charles C. Conner, 4207 SE. 11th Ave., Portland, Oreg. 97202

[21] Appl. No.: 873,256

[22] Filed: Jan. 30, 1978

[51] Int. Cl.² .................................................. H01H 35/00
[52] U.S. Cl. .................................... 307/116; 307/125; 307/143; 328/5
[58] Field of Search ............... 307/116, 141.4, 125, 307/143; 200/DIG. 1, DIG. 2; 328/5; 315/272

[56] References Cited

U.S. PATENT DOCUMENTS

| | | | |
|---|---|---|---|
| 3,549,909 | 12/1970 | Elmsford | 328/5 |
| 3,601,621 | 8/1971 | Ritchie | 307/116 |
| 3,666,988 | 5/1972 | Bellis | 307/116 |

Primary Examiner—L. T. Hix
Assistant Examiner—S. D. Schreyer
Attorney, Agent, or Firm—Oliver D. Olson

[57] ABSTRACT

A bi-directional silicon controlled rectifier forms an electric switch arranged to be connected in an alternating current supply circuit in series with an electric load to be controlled. The gate electrode of the silicon controlled rectifier is connected across the alternating current supply through the input of a full wave rectifier the output of which is connected across a unidirectional silicon controlled rectifier and the gate electrode of which is connected to the output of an oscillator which is controlled by the positive output pulses of a bistable multivibrator. The multivibrator is activated to each of its states by an electric trigger pulse which is generated when a person touches an electrically conductive proximity member connected to one plate of a capacitor, the other plate of which is connected through pulse shaping circuitry to the multivibrator. The output of the rectifier also supplies direct current for operation of the oscillator, multivibrator, proximity plate and shaper circuitry.

10 Claims, 5 Drawing Figures

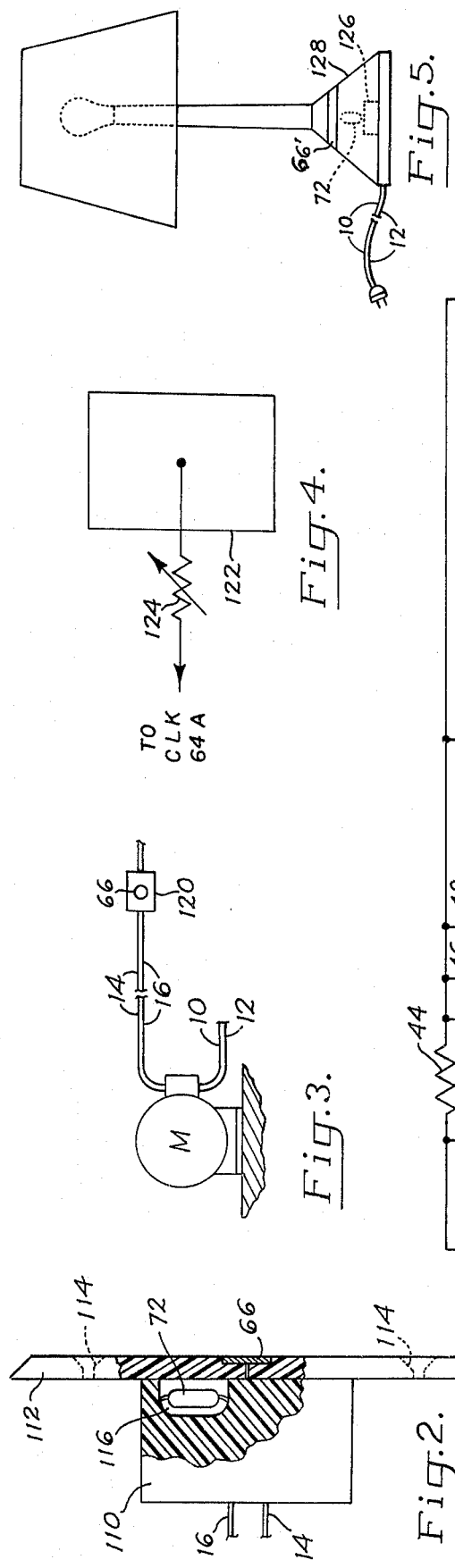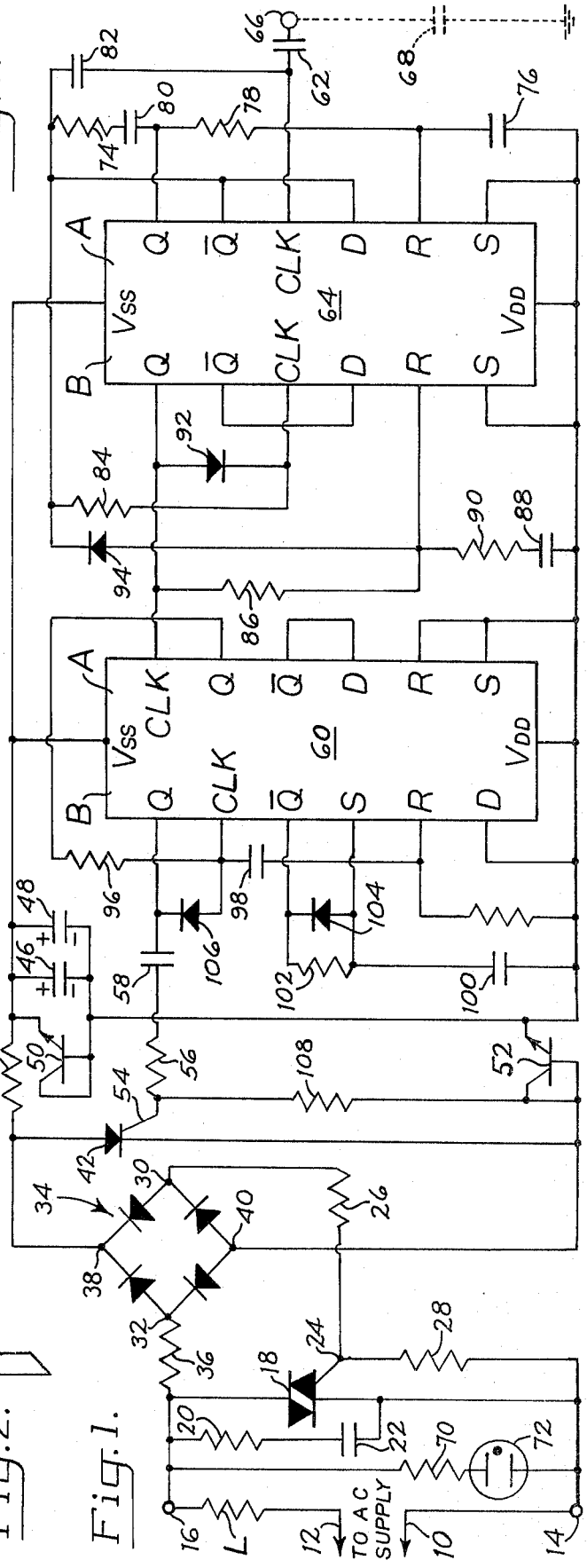

ELECTRONICALLY ACTUATED ELECTRIC SWITCH

BACKGROUND OF THE INVENTION

This invention relates to electric switches for controlling electric loads in alternating current supply circuits, and more particularly to an electronically actuated electric switch which is capable of being connected in series with such a load while also utilizing said alternating current supply as the source of power for the switch.

Control of electric loads in alternating current circuits conventionally is afforded by the use of mechanical switches. Typical of such use is the mechanical wall switch which serves to control room lights in residential, commercial and industrial buildings. Mechanical switches also generally are employed throughout industry in the control of electric motors and other electrically operated equipment.

Electro-mechanical and electronically actuated switches provided heretofore for controlling electric loads in alternating current supply circuits all have required an external source of electric power for their operation. This requirement renders such control systems expensive to install and maintain, and renders excessively costly their substitution for mechanical switches.

Although mechanical switches are relatively inexpensive and easy to install, they are subject to wear and malfunction, requiring frequent replacement. Moreover, mechanical and electro-mechanical switches involved the making and the breaking of mechanical contacts and thus are extremely hazardous in use in environments where the presence of combustible gases can result in damaging fires and explosions.

SUMMARY OF THE INVENTION

In its basic concept, this invention provides an electronically activated electric switch for controlling electric loads in alternating current supply circuits, wherein the electronic components of the switch receive their power either from the same alternating current supply circuit as the load to be controlled, or from a dry cell contained in the switch.

It is by virtue of the foregoing basic concept that the principal objective of this invention is achieved; namely, to overcome the aforementioned disadvantages and limitations of prior electric switches.

Another objective of this invention is the provision of an electronically actuated electric switch of the class described which may replace a conventional mechanical switch, such as a mechanical wall switch for controlling room lighting, without modification of the switch mounting structure.

Still another object of this invention is the provision of an electronically actuated electric switch of the class described which incorporates as an integral part thereof an indicator light by which to give visible indication that an electric load controlled by the switch is in the inactive state. In this regard, when the switch is utilized to control room lighting, the indicator lamp serves effectively as a night light.

A further objective of this invention is the provision of an electrically actuated electric switch of the class described which is controlled by a person making physical contact with or being in close proximity to an electrically conductive proximity member.

A still further objective of this invention is the provision of an electronically actuated switch which is of unitary, solid state construction in which the absence of moving parts precludes the possibility of electric sparking, whereby to render the switch completely safe in explosive atmospheres.

Still another object of this invention is the provision of an electronically actuated electric switch of the class described which is of simplified construction for economical manufacture.

The foregoing and other objects and advantages of this invention will appear from the following detailed description, taken in connection with the accompanying drawings of a preferred embodiment.

BRIEF DESCRIPTION OF THE DRAWING

FIG. 1 is a schematic electrical diagram of an electronically actuated electric switch embodying the features of this invention.

FIGS. 2–5 are side elevational views illustrating a variety of applications for the switch illustrated in FIG. 1.

DESCRIPTION OF THE PREFERRED EMBODIMENT

FIG. 1 of the drawing illustrates the switch of this invention in association with an electric load L connected to a source of alternating current potential. As will appear hereinafter, the electric load may be of any type and the source of alternating current potential may be of any magnitude required to accommodate the load. For example, the load may be an electric light bulb mounted in a permanent fixture in a room, or in the socket of a desk or floor lamp. The alternating current supply thus ordinarily would be a conventional source providing about 120 volts alternating current. The load may be an electric motor of any desired size, in which case the alternating current supply could be 120 volts, 240 volts, or any other required magnitude.

In accordance with this invention, the load controlling electric switch is capable of being connected across the alternating current supply in series with the load L to be controlled. Moreover, it is capable of being actuated electrically by means which receives its source of power from the same alternating current supply as the load to be controlled.

For purposes of the following description, FIG. 1 illustrates the pair of electrical conductors 10, 12 leading from the alternating current supply as being connected one to the switch terminal 14 and the other through the load L to the other switch terminal 16. In FIGS. 2, 3 and 5 these terminals are depicted as elongated flexible conductors.

In the embodiment illustrated, the electrically actuated load-controlling switch is a bi-directional silicon controlled rectifier 18, more generally known as a triac. It is connected across the terminals 14 and 16, and hence across the alternating current supply in series with the load L to be controlled.

A snubber, composed of the series arrangement of resistor 20 and capacitor 22, is connected across the triac to reduce the fast rise time across the triac and thus insure precise control of activation and deactivation of the triac.

The control gate electrode 24 of the triac serves as the electrical actuator therefor. The circuit of this gate electrode includes the series arrangement of the gate electrode, the voltage divider resistance 26 with which the resistance 28 is associated, the input terminals 30 and 32 of a full wave rectifier 34, and the voltage divider resistance 36. This series circuit is connected to the terminals 14 and 16, and hence is connected across the alternating current supply in series with the load to be controlled.

The direct current output terminals 38 and 40 of the rectifier are connected across an electrically actuated shunting switch which, in the embodiment illustrated, comprises a unidirectional silicon controlled rectifier 42. This silicon controlled rectifier functions, upon activation, to short the direct current output of the full wave rectifier, whereupon alternating current from the supply is applied to the control gate electrode 24 of the bi-directional silicon controlled rectifier. The latter thus is activated to complete the electric circuit of the load L across the alternating current supply.

The full wave rectifier performs the additional function of providing direct current for operating the electronic components of the switch described hereinafter. Thus, the positive output terminal 38 of the full wave rectifier is connected through a resistance 44 to one plate of each of a pair of capacitors 46 and 48, and also to the emitter of a zener-connected transistor 50. The other plate of each of the capacitors and the base of the transistor are connected to the emitter of a second zener-connected transistor 52 the base of which is connected to the negative output terminal 40 of the full wave rectifier.

The zener-connected transistor 50 serves to provide a zener diode level of voltage, for example about eight volts, across the storage capacitors 46 and 48. The other zener-connected transistor 52 serves to maintain the voltage to the electronic components hereinafter described to a predetermined level, for example about eight volts, above the ground level of the terminal 14, for purposes described in detail hereinafter.

The control gate electrode 54 of the uni-directional silicon controlled rectifier 42 functions as the electrical actuator by which the rectifier 42 functions as a shunting switch. The gate electrode 54 is connected, through resistor 56 and capacitor 58, to a source of electric drive signals by which the rectifier 42 is activated. In the embodiment illustrated, the electric drive signal generating means comprises an oscillator, in the form of a free-running multivibrator. This is provided by appropriate circuitry connections of the left hand section B of integrated circuit 60. This is a monolithic CMOS integrated circuit of the dual D flip-flop type, such as is provided by model CD4013C of National Semiconductor, Inc. The frequency of oscillation is variable, it being required only that it be higher than the 120 Hertz ripple voltage produced at the anode of the uni-directional silicon controlled rectifier 42 by the output of the full wave rectifier 34.

Since the oscillating frequency of the free-running multivibrator is high with respect to the direct current ripple voltage output of the full wave rectifier, the uni-directional silicon controlled rectifier 42 acts as a zero crossing control. The line frequency rises only a few degrees above zero before the uni-directional silicon controlled rectifier is turned on. Each time the 120 Hertz ripple voltage at the anode of this rectifier 42 goes to zero, the rectifier turns off and is turned on again only by the oscillating frequency from the free-running multivibrator.

Electric control signal generating means is provided for controlling operation of the free-running multivibrator. In the embodiment illustrated, this means is provided by a bistable multivibrator which is formed by appropriate circuitry connections of section A of the integrated circuit 60 referred to hereinbefore. The bistable multivibrator produces output electric control signals which are alternately positive-going and negative-going. In the embodiment illustrated, it is the positive-going signals that effects activation of the free-running multivibrator, the negative-going signals causing the free-running multivibrator to turn off.

Each time the bistable multivibrator is activated, the polarity of the output signal is reversed. It is by virtue of this operation that the switch of this invention is closed and opened alternately with each successive activation of the bistable multivibrator.

Means is provided for producing electric trigger signals by which to activate the bistable multivibrator to each of its states. In the embodiment illustrated, this is provided by a capacitor 62 one plate of which is connected to pulse shaping circuitry provided by a second integrated circuit 64. This integrated circuit is the same as the integrated circuit previously described, and is arranged to provide, by appropriate circuitry connections of its sections A and B, a pair of monostable multivibrators. The trigger signal output from the monostable multivibrator of section B of the integrated circuit is connected to the bistable multivibrator at section B of the first disclosed integrated circuit 60.

The other plate of the capacitor 62 is connected to an electrically conductive proximity member 66 which is disposed either for direct contact by a person, or for close proximity to a person. When the proximity member is touched by a person, the body capacity 68 is charged through the capacitor 62, changing the impedance of the latter and resulting in the development of a trigger signal pulse at the clock terminal (CLK) of section A of the integrated circuit 64. The monostable multivibrators of this integrated circuit function to reshape the trigger pulse to substantially square wave configuration, to provide reliably reproducible trigger signals of predetermined rise and fall times and pulse width to the bistable multivibtator.

In the event a person approaches closely adjacent the proximity member 66, but does not physically touch it, the body capacity 68 of the person effects a change in the impedance of the capacitor 62 and hence a change of impedance at the clock input of section A of the integrated circuit 64. This change in impedance results in the production of an electric trigger signal.

Capacitor 62 serves to provide an external impedance by which to modify the internal impedance associated with the clock input terminal of the integrated circuit 64A and thus reduce the sensitivity of the latter. Thus, if high sensitivity is desired, the external impedance may be omitted. Similarly, capacitor 62 may be replaced by another form of impedance member, such as a resistor, inductor, or diode. In any case, when the electrically conductive proximity member is touched or approached by a person or other object providing a source of electric potential that is different from the potential $V_{ss}$, an electric trigger signal is produced at the clock input terminal of 64A.

When the switch of this invention is to serve as an on-off switch for a light bulb or similar load, the impedance member is capacitor 62 and the proximity member 66 is disposed for direct touching by a person. This arrangement provides maximum reliability of operation of the switch.

As previously mentioned, the zener-connected transistor 52 functions to elevate the voltage to the integrated circuits 60 and 64 to a predetermined value above ground. It is by this means that a potential is provided across the capacitor 62 when the proximity member 66 is touched by a person at a potential other than $V_{ss}$.

It is to be noted that the voltage level of operation for the exemplified integrated circuits is approximately 3.5 volts, the power being in the order of a few picoamperes. Accordingly, the amount of current that is stored in the capacitors 46 and 48 each time the line voltage crosses zero, is more than ample to maintain stable operation of the integrated circuits.

On the other hand, the current output of the free-running multivibrator through capacitor 58 and resistor 56 is not of sufficient magnitude to turn on the uni-directional silicon controlled rectifier 42. However, the extremely fast rise time of the output pulses from the free-running multivibrator is effective to drive the control gate electrode 54 positive very rapidly, thereby turning on the rectifier 42 by virtue of pulse rise time rather than total required gate current.

As previously indicated, in the exemplified embodiment the emitter of transistor 50 is about 16 volts higher than the basecollector circuit of transistor 52 and therefore the output of terminal Q of integrated circuit 60 provides a drive signal to the gate electrode 54 which is about 16 volts above the cathode of the rectifier 42. Although in the example this voltage provides insufficient current to turn on the rectifier, the offset value of the transistors 50 and 52 may be chosen to satisfy the gate current requirements of any suitable type of uni-directional silicon controlled rectifier 42.

Activation of the uni-directional silicon controlled rectifier functions merely to close the full wave diode bridge rectifier 34. This enables the application of alternating current from the supply to the control gate electrode 24 of the bi-directional silicon controlled rectifier 18. It will be recognized that the gate sensitivity of the triac is insufficient to be driven directly by current provided by the free-running multivibrator, or by the rise time provided by the output pulses from the free-running multivibrator.

Connected across the terminals 14 and 16 of the switch is the series arrangement of current limiting resistor 70 and neon lamp 72. When the triac is turned off, the alternating current supply appears across the neon lamp, through the current limiting resistor, turning the neon lamp on. This gives visual indication that the load L to be controlled is turned off. This is of value particularly when the load to be controlled is at a location remote from the switch. In the event the load L is a light bulb associated with a room or with a lamp, the neon lamp serves effectively as a night light.

The operation of the electronically actuated electric switch described hereinbefore is as follows:

Let it be assumed that the alternating current supply and the load L to be controlled are connected to the terminals 14 and 16 of the switch, as indicated in FIG. 1. In this quiescent state of the switch, with no current applied through the load L, the alternating current supply is connected across the neon indicator lamp 72, lighting the latter to give visual indication that the load is not energized.

Each time the sine wave of the alternating current supply crosses zero, a small amount of current is extracted and stored in the capacitors 46 and 48. As previously exemplified, this is about eight volts above ground, as established by the zener-connected transistors 50 and 52. The plate of the capacitor 62 connected to the clock terminal of section A of the integrated circuit 64 also has a potential of about eight volts above ground applied to it through resistor 74.

Let it now be assumed that a person contacts the electrically conductive proximity member 66. The body capacity 68 between the touched proximity member and earth potential is charged through the capacitor 62 which draws a tiny amount of current, in the order of a few picoamperes, through the impedance of the clock terminal of section A of the integrated circuit 64. This causes the clock to shift state, either to positive or negative. If the clock terminal goes negative, no transition occurs. When the clock terminal goes positive, the transition of terminal Q to terminal $\overline{Q}$ does occur, and high information of $\overline{Q}$ applied to data terminal D is transferred to Q.

When terminal Q goes high, the capacitor 76 is charged through the resistor 78. The time constant of resistor 78 and capacitor 76 must be longer than the 60 Hertz of the alternating current source, in order to prevent the load L from turning on and off during the time that physical contact is made with the proximity member. Filter capacitors 80 and 82 reduce the input spikes that appear across capacitor 62 to a level below the threshold level of the clock input and serve as a sensitivity control.

The charging of capacitor 76 through the resistor 78 provides a time delay in pulling reset terminal R high to allow time for the transition to be transferred over to section B of the integrated circuit 64. Once this transition has been accomplished, the capacitor 76 then charges to a value high enough to reset section A of the integrated circuit 64, when terminal R is pulled to the voltage level $V_{ss}$. With R thus rest high, it drives Q low and $\overline{Q}$ high, reestablishing the original state for the next cycle of operation. In that state, the capacitor 62 is once again supplied with a potential of about eight volts through resistor 74.

The fast rising pulse from $\overline{Q}$ of section A of the integrated circuit 64 is applied through the resistor 84 to the clock terminal of the B section thereof. The data terminal D of the B section now has high input information from $\overline{Q}$, the reset terminal R is pulled low through the resistor 86, and the capacitor 88 discharged to zero.

When the clocking pulse arrives from section A of the integrated circuit 64 at the clock input of section B, the information high at data terminal D is transferred to terminal Q. $\overline{Q}$ now goes low, Q goes high and the capacitor 88 begins to charge through the resistors 86 and 90 toward $V_{ss}$. When the charge on capacitor 88 reaches the threshold reset level of the reset input R, Q is driven low and the capacitor 88 discharges through the resistors 86 and 90. Resistor 90 serves as a current limiting resistor for the input of reset terminal R to prevent surge currents from damaging the integrated circuit. The diode 92 acts to stabilize the clock line input of section B of the integrated circuit 64 through resistor 84 by pulling the clock high when terminal Q goes high. The diode 94 acts as an additional discharge path through Q of section A of the integrated circuit 64, and clamps the reset terminal R of the section B to zero during the clock period of section B.

By utilizing the two monostable multivibrators in the manner described hereinbefore, noise rejection by the integrated circuit 64 is at an acceptable level, whereby the circuit can be used to clock the bistable multivibrator of section A of the integrated circuit 60.

In the start, or off condition of section A of the integrated circuit 60, the clock input is held low by terminal $\overline{Q}$ of section B of the integrated circuit 64. $\overline{Q}$ is high, the information at the data terminal D is high and the inputs at the reset R and set S terminals are both at ground potential. When the positive transition on the clock input from section B of the integrated circuit 64 reaches the clock threshold of the bistable multivibrator, information on the data terminal D is transferred to Q. Q goes high, $\overline{Q}$ goes low and the information on the data terminal D is now low. The bistable multivibrator now is in a stable state with Q high and $\overline{Q}$ low. The next positive transition of the clock input from section B of the integrated circuit 64 causes Q to go low and $\overline{Q}$ to go high, whereupon the bistable multivibrator is in its second stable state.

When Q of the bistable multivibrator of section A of integrated circuit 60 goes low, it pulls and holds the clock input of the free-running multivibrator of section B of integrated circuit 60 low through resistor 96, discharging the capacitor 98 and stopping the free-running multivibrator. When the bistable multivibrator provides a high input for the clock pulse of the free-running multivibrator, the latter is now free to operate as a free-running multivibrator, or oscillator.

Assuming the free-running multivibrator 60B starts with Q low, $\overline{Q}$ high, reset R low and data D connected to ground, capacitor 100 begins to charge through resistor 102 from the high condition of $\overline{Q}$ of 60B. When the capacitor 100 charges to the threshold level of the set terminal S, $\overline{Q}$ is driven low and Q is driven high, the capacitor is discharged through diode 104 by way of $\overline{Q}$ and S is clamped to ground through the diode. With Q of the bistable multivibrator 60A being high, it starts to charge capacitor 98 through resistor 96. When the clock terminal of 60B reaches its threshold level, Q of 60B is driven low, because D is low. $\overline{Q}$ is driven high, capacitor 98 is discharged through diode 106 and the clock terminal is clamped low by diode 106 by way of Q. Thus, the conditions are reestablished for the next cycle.

When Q of the bistable multivibrator 60A is high, capacitor 98 is supplied with charging voltage by way of resistor 96. When Q is pulled low with a latching action, the clock terminal of the freerunning multivibrator 60B is now held in the "off" condition. Since 60A is a bistable multivibrator, each positive-going transition at the clock terminal causes it to change its stable state, thereby providing a stable "on" or "off" condition for the free-running multivibrator 60B.

The diodes 104 and 106 act to discharge the capacitors 100 and 98, respectively, at a very rapid rate, allowing the free-running multivibrator to operate at the RC time constant of the resistor 102 and capacitor 100 for one half of each cycle and resistor 96 and capacitor 98 for the other half of each cycle.

The output of Q of the free-running multivibrator, through the capacitor 58, drives the gate 54 of the uni-directional silicon controlled rectifier 42 through the voltage divider resistors 56 and 108. As explained hereinbefore, the fast rise time of the pulses through the capacitor and resistor drive the control gate electrode 54 positive very rapidly, causing the uni-directional silicon controlled rectifier to turn on.

Activation of the uni-directional silicon controlled rectifier 42 results in shorting of the direct current output of the full wave bridge rectifier 34, whereupon alternating current from the supply is applied to the control gate electrode 24 of the triac 18. The triac thus is activated, completing the alternating current circuit of the load L.

With the triac now conducting, the voltage across it is less than 2 volts, and therefore the neon indicator lamp 72 is extinguished, giving visual indication that the load is energized.

The switch described hereinbefore is versatile in its utility. FIG. 2 illustrates the integration of the components into a one-piece, solid stage wall switch for replacement of a standard type mechanical switch conventionally used for controlling room lighting. As illustrated, the electronic circuitry between the terminals 14, 16 and proximity member 66 is confined within a mass of potting material 110, and the latter bonded integrally to the back side of a plastic plate 112 which serves as the ornamental escutchon plate normally abutting the surface of a room wall and concealing the electrical connector box and wiring located within the wall. Counter sunk openings 114 through the cover plate are arranged to receive attaching screws by which the switch is secured to the electrical outlet box mounted within a cavity in the wall structure.

In the embodiment illustrated in FIG. 2, the cover plate is made of translucent plastic material and a cavity 116 is formed within the potting material 110 to house the neon lamp 72. Thus, when the room light is turned off, the neon lamp is lit and it provides a faint glow through the translucent cover plate to provide an attractive night light.

Embedded or otherwise bonded to the outer surface of the cover plate is an electrically conductive proximity plate 66 which, as described hereinbefore, is disposed for access by persons for the purpose of turning the room light on and off.

Referring now to FIG. 3 of the drawing, the switch described hereinbefore may be integrated in the manner illustrated in FIG. 2, or otherwise integrated into a housing 120 adapted for mounting at a remote position from an electric motor M which it is to be controlled. As explained hereinbefore, the neon lamp may serve in this instance as visual indication whether the electric motor is energized.

FIG. 4 illustrates the switch of FIG. 1 associated with an object 122, of synthetic plastic, ungrounded metal, or other material, which is subject to the accumulation of static electricity which it is desired to discharge before reaching a hazardous level. For this purpose, the object is connected electrically to the clock input terminal of section A of integrated circuit 64. This connection preferably is made through a potentiometer 124, in place of capacitor 62, in order to adjust the sensitivity level at which an electric trigger signal is produced.

FIG. 5 illustrates the switch described hereinbefore potted or otherwise confined in a housing 126 and mounted in the base 128 of a desk lamp. In the preferred embodiment illustrated, the base of the lamp is formed of translucent material through which the neon lamp 72 provides a faint glow, as a night light. An electrically conductive band 66' is provided about a portion of the surface of the base to provide the proximity member.

Accordingly, the lamp may be turned on and off simply by touching the conductive band on the base.

The use of the direct current output of the full wave rectifier 34 in charging the storage capacitors 46 and 48 for supplying voltage and current to the electronic components, has the obvious advantage of being able to supply the entire switch with electric power from the same alternating current supply as the load to be controlled. However, there may be instances in which it is desirable to utilize an external source of power for the electronic components associated with the integrated circuits. In such instance, the capacitors 46, 48 and transistor 50 may be replaced by a conventional, inexpensive, 9 volt dry cell battery. The extremely low power required to drive the integrated circuits, which is in the order of a few picoamperes, provides such a dry cell with a useful life of several months. The dry cell may be integrated removably with the other components of the switch, so that no external wiring to an external power source is needed.

From the foregoing it will be appreciated that the present invention provides an electronically actuated electric switch which is capable of installation in an alternating current supply circuit of an electric load in series with the load, while also utilizing the same alternating current supply as the source of power for the electronic components of the switch. The small amount of current that is extracted from the line voltage each time it crosses zero is in the order of a few hundred microamperes and in no way causes any appreciable loss of power to the load to be controlled. The switch is of economical construction and small in size, thereby rendering it highly versatile in its application to a wide variety of uses.

It will be apparent to those skilled in the art that various changes may be made in the size, shape, type, number and arrangement of parts described hereinbefore, without departing from the spirit of this invention.

Having now described my invention and the manner in which it may be used, I claim:

1. A switch for controlling an electric load in an alternating current supply circuit, comprising:
   (a) electrically actuated load-control bi-directional switch means arranged to be connected across an alternating current supply circuit in series with a load to be controlled,
   (b) electrical actuator means for the load-control switch,
   (c) full wave rectifier means having an alternating current input and a direct current output,
   (d) the electric load-control switch actuator means and the input of the rectifier means being connected together electrically in series and said series being connected across the load-control switch means,
   (e) electrically actuated shunting switch means connected across the output of the rectifier means for releasably shunting said output and operable when actuated to shunt the direct current output of the rectifier means and apply alternating current from the supply circuit to the electrical actuator means for the load-control switch means, whereby to activate the latter and connect the electric load across the alternating current supply,
   (f) electrical actuator means for the shunting switch means,
   (g) electric drive signal generating means connected to the shunting switch actuator means and operable when activated by an electric control signal of predetermined polarity to provide an electric drive signal to said shunting switch actuator means to actuate the shunting switch means,
   (h) electric control signal generating means having an output connected to the electric drive signal generating means and operable upon successive applications of an electric trigger signal to produce alternate positive-going and negative-going electric control signals,
   (i) electric trigger signal generating means connected to the electric control signal generating means and including an impedance member,
   (j) a source of electric potential connected to the trigger signal generating means, and
   (k) an electrically conductive proximity member connected to the impedance member and arranged for contact or close proximity by a source of electric potential different from the potential applied to the trigger signal generating means, whereby to produce an electric trigger signal.

2. The switch of claim 1 wherein the source of electric potential is the direct current output of the rectifier means.

3. The switch of claim 2 including capacitance means connected to the direct current output of the rectifier means for storing current from said rectifier output.

4. The switch of claim 2 including voltage elevating means connecting one terminal of the rectifier output to the trigger signal generating means for providing said electric potential with a predetermined reference.

5. The switch of claim 4 wherein the voltage elevating means comprises zener diode means.

6. The switch of claim 1 wherein
   (a) the electrically actuated load-control switch means comprises a bi-directional silicon controlled rectifier and the electrical actuator means for the load-control switch means comprises the control gate electrode of the bi-directional silicon controlled rectifier,
   (b) the electrically actuated shunting switch means comprises a uni-directional silicon controlled rectifier and the electrical actuator means for the shunting switch means comprises the control gate electrode of the uni-directional silicon controlled rectifier,
   (c) the electric drive signal generating means comprises a freerunning multivibrator providing intermittent electric drive signals at a frequency greater than the frequency of the ripple voltage output of the full wave rectifier means,
   (d) the electric control signal generating means comprises a bistable multivibrator having an output connected to the freerunning vibrator, and
   (e) the electric trigger signal generating means comprises pulse shaper means having an output connected to the bistable multivibrator.

7. The switch of claim 6 wherein the impedance member is a capacitor one plate of which is connected to the pulse shaper means and the other plate of which is connected to the proximity member.

8. The switch of claim 6 wherein the source of electric potential is the direct current output of the rectifier means connected to capacitance means for storing current from said rectifier output, said capacitance means being connected to the free-running multivibrator, bistable multivibrator and pulse shaper means for supplying said components with an electric potential.

9. The switch of claim 6 including voltage elevating means connecting one terminal of the rectifier output to the free running multivibrator, bistable multivibrator and pulse shaper means for providing said electric potential with a predetermined reference.

10. The switch of claim 9 wherein the voltage elevating means comprises zener diode means.

* * * * *